(12) United States Patent
Razdan et al.

(10) Patent No.: US 9,964,719 B1
(45) Date of Patent: May 8, 2018

(54) FAN-OUT WAFER LEVEL INTEGRATION FOR PHOTONIC CHIPS

(71) Applicant: Cisco Technology, Inc., San Jose, CA (US)

(72) Inventors: Sandeep Razdan, Burlingame, CA (US); Vipulkumar Patel, Breinigsville, PA (US); Matthew J. Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days. days.

(21) Appl. No.: 15/582,370

(22) Filed: Apr. 28, 2017

(51) Int. Cl.
| | |
|---|---|
| G02B 6/42 | (2006.01) |
| G02B 6/138 | (2006.01) |
| G02B 6/34 | (2006.01) |
| H01L 21/56 | (2006.01) |
| H01L 23/00 | (2006.01) |
| H01L 25/16 | (2006.01) |
| H01L 21/768 | (2006.01) |
| H01L 21/78 | (2006.01) |
| H01L 23/31 | (2006.01) |
| H01L 23/538 | (2006.01) |

(52) U.S. Cl.
CPC .......... *G02B 6/4255* (2013.01); *G02B 6/138* (2013.01); *G02B 6/34* (2013.01); *G02B 6/428* (2013.01); *H01L 21/565* (2013.01); *H01L 21/76802* (2013.01); *H01L 21/76877* (2013.01); *H01L 21/78* (2013.01); *H01L 23/3107* (2013.01); *H01L 23/5389* (2013.01); *H01L 24/03* (2013.01); *H01L 25/167* (2013.01); *H01L 2224/0231* (2013.01); *H01L 2224/02373* (2013.01); *H01L 2224/02379* (2013.01); *H01L 2224/0346* (2013.01); *H01L 2224/0401* (2013.01); *H01L 2224/16145* (2013.01)

(58) Field of Classification Search
None
See application file for complete search history.

(56) References Cited

U.S. PATENT DOCUMENTS

| | | | |
|---|---|---|---|
| 8,884,422 B2 | 11/2014 | Goh et al. | |
| 8,901,576 B2 | 12/2014 | Doany et al. | |
| 8,916,481 B2 | 12/2014 | Gan et al. | |
| 2004/0150081 A1* | 8/2004 | Ogawa | G02B 6/43 257/678 |
| 2005/0018977 A1* | 1/2005 | Beer | G02B 6/4292 385/88 |
| 2012/0177381 A1* | 7/2012 | Dobbelaere | H01L 21/84 398/139 |
| 2015/0036970 A1* | 2/2015 | Lai | G02B 6/13 385/14 |

(Continued)

*Primary Examiner* — Mike Stahl
(74) *Attorney, Agent, or Firm* — Patterson + Sheridan, LLP

(57) ABSTRACT

The present disclosure discloses an assembly. The assembly includes a photonic chip and an electrical chip disposed side by side. The assembly also includes mold compound that encapsulates the photonic chip and the electrical chip. The assembly further includes a redistribution layer (RDL) that extends across the top surface of the photonic chip and the top surface of the electrical chip and connects the photonic chip with the electrical chip. Moreover, the photonic chip includes an exposed optical interface for transmitting optical signals between the photonic chip and an external optical device.

19 Claims, 15 Drawing Sheets

(56) References Cited

U.S. PATENT DOCUMENTS

| | | | |
|---|---|---|---|
| 2015/0061137 A1* | 3/2015 | Lee | H01L 23/48 257/758 |
| 2015/0323738 A1* | 11/2015 | Sekiguchi | G02B 6/12004 385/14 |
| 2016/0223765 A1* | 8/2016 | Krabe | G02B 6/426 |
| 2017/0199328 A1* | 7/2017 | Shubin | G02B 6/122 |
| 2017/0254968 A1* | 9/2017 | Ding | G02B 6/13 |

* cited by examiner

TOP VIEW

SIDE VIEW

FAN-OUT WAFER LEVEL INTEGRATION FOR PHOTONIC CHIPS

BACKGROUND

A photonic chip and an electrical chip can be wire bonded to a common substrate. However, using wire bonding to connect a photonic chip and an electrical chip to a common substrate has several drawbacks. For example, using wire bonding to connect the photonic chip and the electrical chip to a common substrate requires the use of external ceramics or BGA substrates with vertical interconnect accesses (vias), which is not desired for achieving dense integration with other application-specific integrated circuits (ASICs). Also, using wire bonding to connect the photonic chip and the electrical chip to a common substrate requires that the I/O interfaces are arranged on the top surface of the photonic chip, which limits the number of I/O interfaces.

SUMMARY

One embodiment presented in this disclosure discloses a method. The method includes encapsulating a photonic chip and a first electrical chip using a mold compound, wherein the photonic chip and the first electrical chip are disposed side by side with respective top surfaces facing a same direction, wherein the respective top surfaces are free from the mold compound after encapsulating the photonic chip and the first electrical chip. The method also includes forming a first redistribution layer (RDL) that extends across the top surface of the photonic chip and the top surface of the first electrical chip, wherein the first RDL is configured to connect the photonic chip with the first electrical chip. The method further includes removing the mold compound to expose an optical interface on the photonic chip, and aligning an external optical device to the optical interface, wherein the external optical device and the photonic chip are configured to transmit optical signals through the optical interface.

Another embodiment presented in this disclosure discloses an assembly. The assembly includes a photonic chip, a first electrical chip, and a mold compound configured to encapsulate the photonic chip and the first electrical chip, wherein the photonic chip and the first electrical chip are disposed side by side with respective top surfaces facing a same direction, wherein the respective top surfaces are free from the mold compound after encapsulating the photonic chip and the first electrical chip. The assembly also includes a first redistribution layer (RDL) that extends across the top surface of the photonic chip and the top surface of the first electrical chip, wherein the first RDL is configured to connect the photonic chip with the first electrical chip; wherein the photonic chip comprises an exposed optical interface configured to transmit optical signals between the photonic chip and an external optical device.

Another embodiment presented in this disclosure discloses an assembly. The assembly includes a photonic chip. The photonic chip comprises a first side, a second side and a third side, wherein the first, second and the third sides are perpendicular to a top surface and an opposite bottom surface of the photonic chip, and wherein the top surface and the bottom surface of the photonic chip comprise pads for attaching solder bumps. The assembly also includes a first electrical chip facing the first side of the photonic chip and a first redistribution layer (RDL) that extends across the top surface of the photonic chip and a top surface of the first electrical chip, wherein the first RDL is configured to connect the photonic chip with the first electrical chip. The assembly further includes an exposed optical interface on the third side of the photonic chip and a mold compound configured to cover the first side and the second side of the photonic chip without covering the third side of the photonic chip.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In order to mitigate the drawbacks of using wire bonding to connect a photonic chip and an electrical chip to a common substrate, in one approach, the photonic chip itself can include through silicon vias (TSVs). In this way, the photonic chip can use its internal TSVs to connect to the common substrate rather than using wire bonds. However, including TSVs in photonic chips may increase the packaging complexity due to TSV design rule limitations and the associated cost.

In one embodiment, the photonic chip and the electrical chip are connected with each other to form an assembly using a fan-out wafer level integration. That is, an entire reconstituted wafer is used to produce multiple assemblies. Each assembly includes the photonic chip and the electrical chip connected with each other. The photonic chip and the electrical chip are encapsulated using a mold compound. The top surfaces of the photonic chip and the electrical chip are disposed side by side and are facing a same direction. The top surfaces of the photonic chip and the electrical chip are not covered by the mold compound. A first RDL extends across the top surfaces of the photonic chip and the electrical chip and interconnects the photonic chip and the electrical chip. Moreover, the photonic chip includes an optical interface which can be used to transmit optical signals between the photonic chip and an external optical device.

Figure 1:
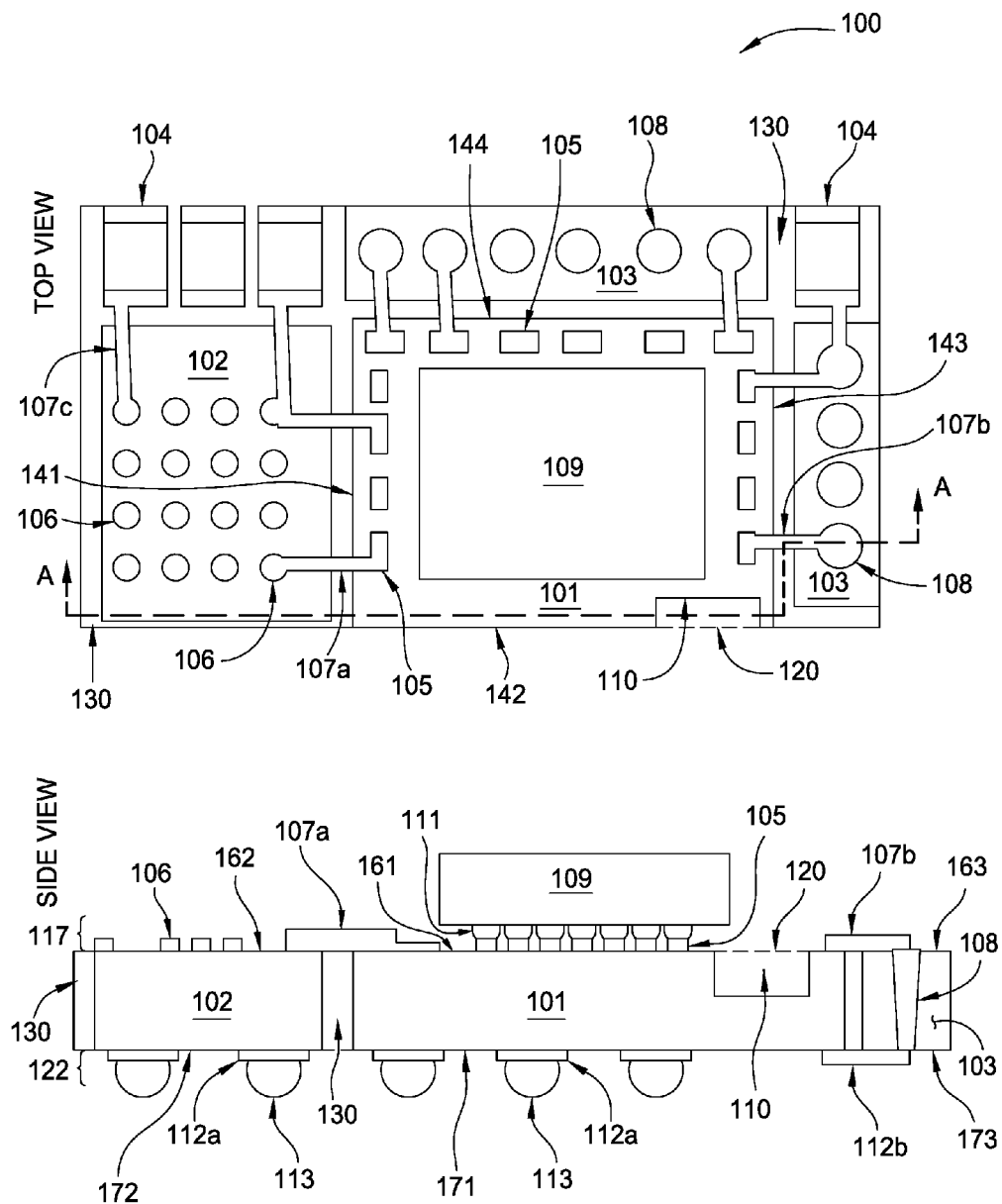
FIG. 1 illustrates an assembly, according to one embodiment herein.

FIG. 1 illustrates an assembly 100 from the top view and the side view, respectively, according to one embodiment herein. As shown by the top view, the assembly 100 includes a photonic chip 101, a first electrical chip 102, one or more substrates 103, one or more passive circuit components 104, and a second electrical chip 109. In one embodiment, the first electrical chip 102 is a chip for processing digital electrical signals. The substrates 103 can be planar substrates made of silicon or other semiconductor materials as understood in the art and the passive circuit components 104 can be discrete capacitors and/or resistors. In one embodiment, the second electrical chip 109 includes high frequency electrical signaling such as drivers and/or transimpedance amplifiers (TIAs) coupled to the photonic chip 101.

The photonic chip 101, the first electrical chip 102, the substrates 103, and the passive circuit components 104 are disposed side by side with respective top surfaces facing a same direction rather than in, for example, a vertical stack. The photonic chip 101, the first electrical chip 102, and the substrates 103 have respective top surfaces 161, 162 and 163 and respective bottom surfaces 171, 172 and 173. For example, in FIG. 1, the photonic chip 101 has four sides 141, 142, 143 and 144. The first electrical chip 102 is disposed in a facing relationship with the side 141. The two substrates 103 are disposed in facing relationships with sides 143 and 144, respectively. The top surfaces of the photonic chip 101, the first electrical chip 102, the substrates 103 and the passive circuit components 104 are facing the top view. The four sides 141-144 are perpendicular to the top surface and the bottom surface of the photonic chip 101 which is opposite to the top surface and not shown in the top view of FIG. 1.

The photonic chip 101, the first electrical chip 102, the substrates 103 and the passive circuit components 104 are encapsulated by a mold compound 130. In one example, the mold compound 130 is an epoxy mold compound. While the mold compound 130 is disposed on at least two sides of the photonic chip 101 and the first electrical chip 102, in one embodiment, the mold compound 130 is not disposed on or does not cover the respective top surfaces 161 and 162 of the photonic chip 101 and the first electrical chip 102. That is, the top surfaces of the photonic chip 101 and the first electrical chip 102 are free from the mold compound 130. Also, in this embodiment, the side 142 of the photonic chip 101 is exposed and not covered by the mold compound 130 but in other embodiments, the side 142 may also be encapsulated by the mold compound 130. The second electrical chip 109 is attached to the top surface of the photonic chip 101.

The photonic chip 101 includes multiple pads 105 on its top surface and the first electrical chip 102 includes multiple pads 106 on its top surface. In one example, the pads 105 and 106 are made of copper or other materials as understood in the art. Also, each of the substrates 103 includes multiple through-vias 108 that extend through the substrates 103. In one embodiment, the through-vias 108 protrude from the bottom and top surfaces of the substrates 103. In one example, the through-vias 108 are made of copper or other materials as understood in the art.

In one embodiment, electrical connections 107 are used to connect multiple components of the assembly 100. For example, as shown in FIG. 1, the photonic chip 101 and the first electrical chip 102 are connected with each other using an electrical connection 107a. More specifically, the electrical connection 107a connects one or more pads 105 on the top surface of the photonic chip 101 and one or more pads 106 on the top surface of the first electrical chip 102. In one embodiment, the pads 105 and 106 are solder pads coupled to solder bumps. In another example, the pads 105 and 106 are coupled to the electrical connections 107. In another example, the photonic chip 101 and the substrates 103 are connected with each other using the electrical connections. More specifically, the electrical connection 107b connects one or more pads 105 on the top surface of the photonic chip 101 and the through-vias 108 on the substrate 103. In another example, the first electrical chip 102 and/or the substrates 103 can be connected to the passive circuit components 104 using the electrical connections, e.g., the electrical connection 107c. In one embodiment, the electrical connections are included in a first RDL formed on the top surfaces of the photonic chip 101, the first electrical chip 102, the substrates 103, and/or the passive circuit components 104, as described in detail below.

The photonic chip 101 may include a trench 120. One side of the trench 120 provides an optical interface 110 used to transmit optical signals between the photonic chip 101 and an external optical device, e.g., a laser. In one embodiment, the side providing the optical interface 110 is parallel to the side 142 and perpendicular to the top surface of the photonic chip 101. In one embodiment, the side 142 and the optical interface 110 are exposed and not covered by the mold compound 130 and the electrical connections in the first RDL.

The side view in FIG. 1 is a cross section of the assembly 100 from the direction A, as indicated in the top view of FIG. 1. In one embodiment, the respective top surfaces 161, 162, and 163 of the photonic chip 101, the first electrical chip 102, and the substrates 103 are all disposed on the same plane. In one embodiment, a first RDL 117 is formed on the top surfaces of the photonic chip 101, the first electrical chip 102, and the substrates 103. As described above, the photonic chip 101 is connected to the first electrical chip 102 using the electrical connection 107a in the first RDL 117. Also, the photonic chip 101 is connected to the substrate 103 using the electrical connection 107b in the first RDL 117. The substrate 103 includes through-vias 108 crossing through the substrate 103. The electrical connection 107b connects the photonic chip 101 to the through-vias 108.

From the side view, the second electrical chip 109 is disposed above the photonic chip 101 and attached to the top surface 161 of the photonic chip 101 using the solder bumps 111 disposed on the pads 105. The photonic chip 101 and the first electrical chip 102 have pads 112a on the respective bottom surfaces 171 and 172 which are connected via a RDL 122 and the through-vias 108. The pads 112a have attached solder bumps 113. In one embodiment, the solder bumps 113 attach the assembly 100 to a printed circuit board (PCB) (not shown in FIG. 1). In one embodiment, the solder bumps 111 and 113 are made of copper or other materials as understood in the art. The photonic chip 101 and the substrate 103 are connected using the electrical connection 112b on the respective bottom surfaces 171 and 173. In one embodiment, the pads 112a and the electrical connection 112b are formed in the second RDL 122 on the respective bottom surfaces of the photonic chip 101, the first electrical chip 102 and the substrate 103.

FIG. 1 illustrates only one embodiment of the assembly 100. In other embodiments, in the assembly 100, the photonic chip 101 can be connected to multiple different electrical chips 102. In other embodiments, the assembly 100 can include multiple photonic chips 101 connecting to one or more electrical chips 102. In other embodiments, in the assembly 100, substrates 103 are not needed. Instead, through-via holes can be directly created in the mold compound 130 using a laser drilling process and the drilled through-via holes can be plated and filled with copper, as understood in the art. In other embodiments, the photonic chip 101, the first electrical chip 102, the substrates 103 and the passive circuit components 104 can be disposed side by side at different positions. In other embodiments, the assembly 100 can include different numbers of substrates 103 and/or passive circuit components 104. In other embodiments, the electrical chip 102 may be omitted.

Figure 2:
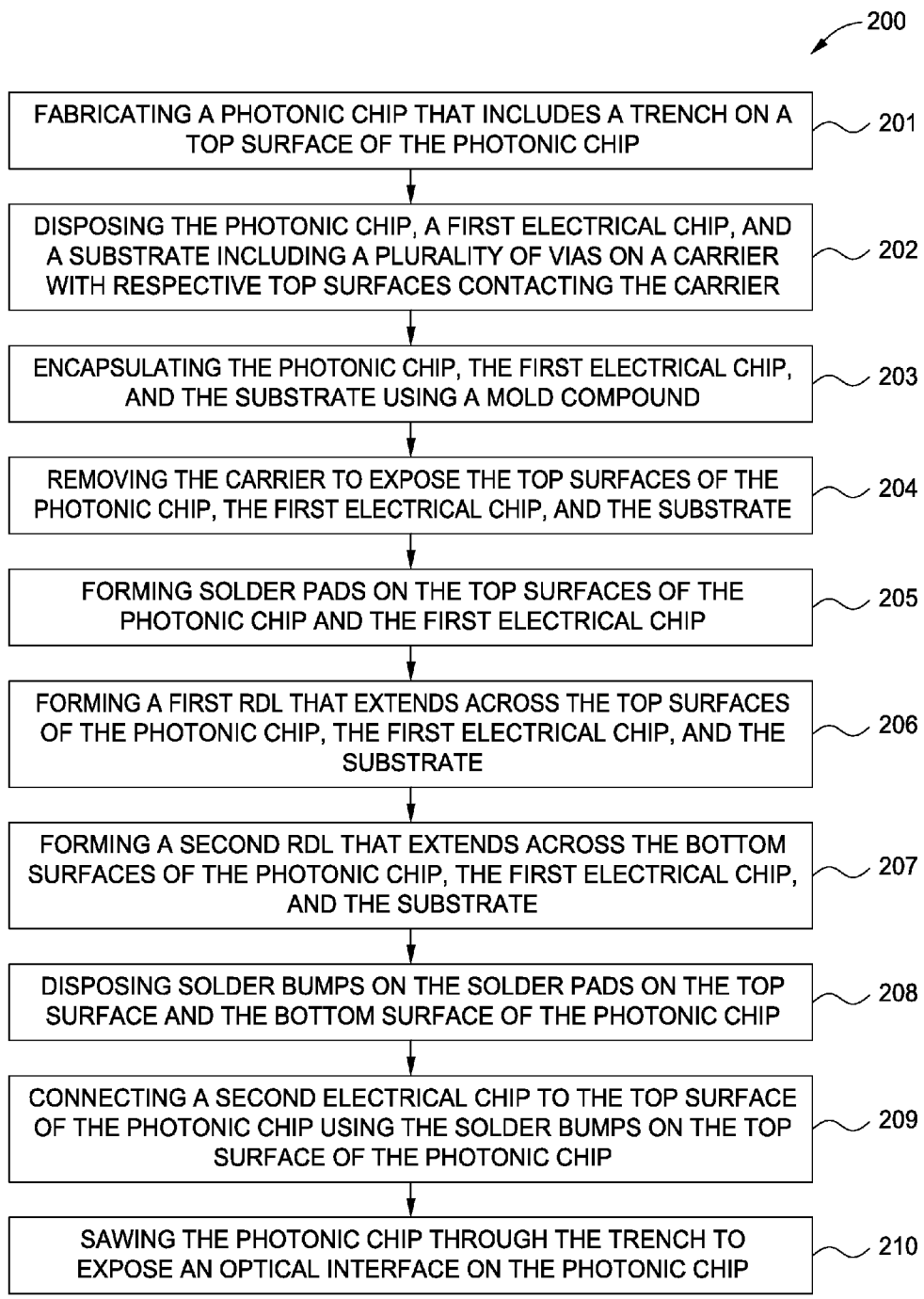
FIG. 2 illustrates a flowchart of a method for integrating the assembly, according to one embodiment herein.
Figure 3:
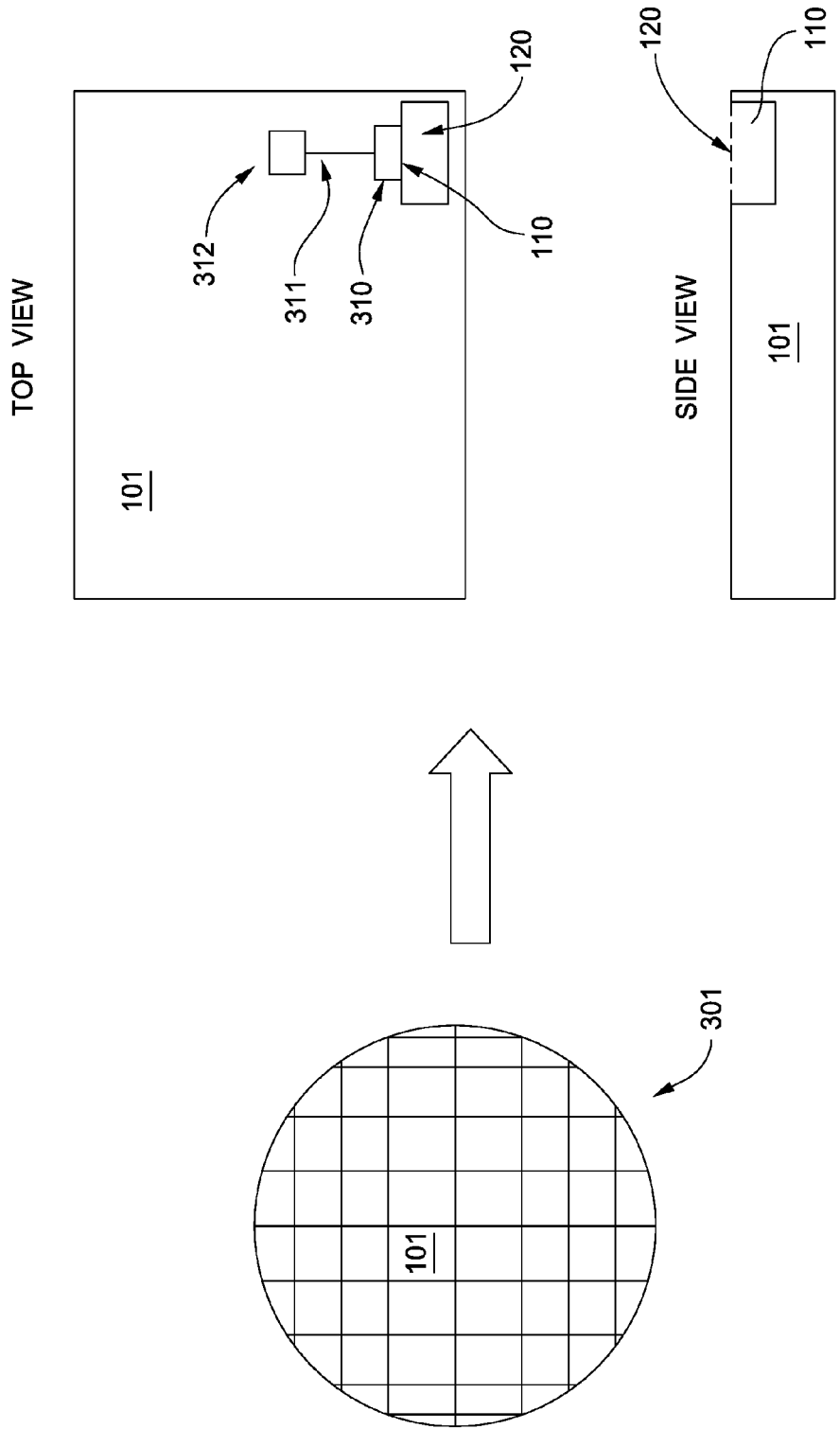
FIG. 3 is a flowchart for fabricating a photonic chip, according to one embodiment herein.

FIG. 2 illustrates a flowchart of a method 200 for integrating the assembly 100, according to one embodiment herein. In one embodiment, the method 200 describes a fan-out wafer level integration process. For ease of explanation, the method 200 is described in parallel with FIGS. 3-11. The method 200 begins with at block 201, which is described using FIG. 3. At block 201, the photonic chip 101 is fabricated with the trench 120 on its top surface. FIG. 3 illustrates the photonic chip 101 which includes the trench 120 on its top surface, according to one embodiment herein. In FIG. 3, a wafer 301 includes multiple fabricated photonic chips 101 (each grid in the wafer 301 is a photonic chip 101). The wafer 301 is diced to provide separate fabricated photonic chips 101.

For the photonic chips 101, a trench 120 is created on the top surface of the photonic chip 101, e.g., through a deep reactive-ion etching (DRIE) process. In one embodiment, the trench 120 can be created for each photonic chip 101 while the photonic chips 101 are integrated into the wafer or after the wafer 301 has been diced. As described above, one side of the trench 120 provides an optical interface 110 used to transmit optical signals between the photonic chip 101 and an external optical device, e.g., a laser. In one embodiment, the optical interface 110 is coupled to an optical coupler 310 inside the photonic chip 101. The optical coupler 310 connects to an optical component 312 inside the photonic chip 101 through one or more waveguides 311. The optical interface 110 is used to transmit optical signals between the optical coupler 310 and an external optical device.

In one embodiment, the optical coupler 310 is an edge coupler designed to efficiently couple to an external optical device (e.g., a laser or fiber optic cable). Because the dimensions of the waveguide 311 (e.g., a submicron silicon waveguide) may result in high optical losses if directly connected to the external optical device, the external optical device may instead be coupled to the optical coupler 310 which then transfers the signal into the waveguide 311. Doing so may eliminate the need for using lenses between the external optical device and the waveguide 311 which focus the optical signal into a mode with a diameter similar to the dimensions of the waveguide 311. Stated differently, in one embodiment, the optical coupler 310 permits the external optical device to be butt-coupled to the optical interface 110 of the photonic chip 101 and transmit light directly into photonic chip 105 without the addition of external focusing elements such as lenses.

In one embodiment, the optical coupler 310 is formed from at least one tapered waveguide where the width of the waveguide varies as the optical coupler 310 extends away from the optical interface 110. In one example, the optical coupler 310 may include a plurality a tapered waveguides arranged on multiple layers for adjusting the mode size of the optical signal when between transferred between the waveguide 311 and an external optical device.

Figure 4:
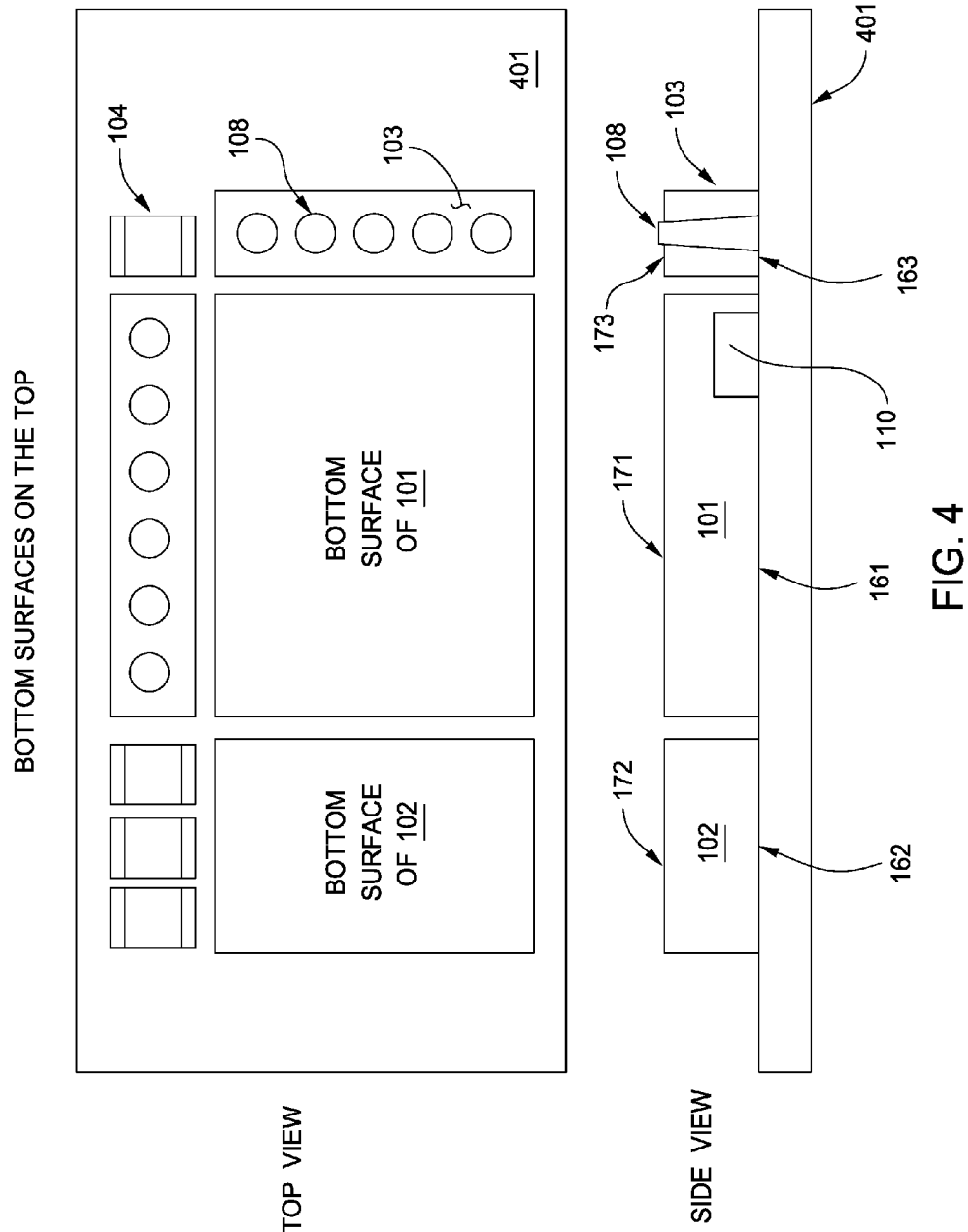
FIG. 4 illustrates disposing components of the assembly on a carrier, according to one embodiment herein.
Figure 5:
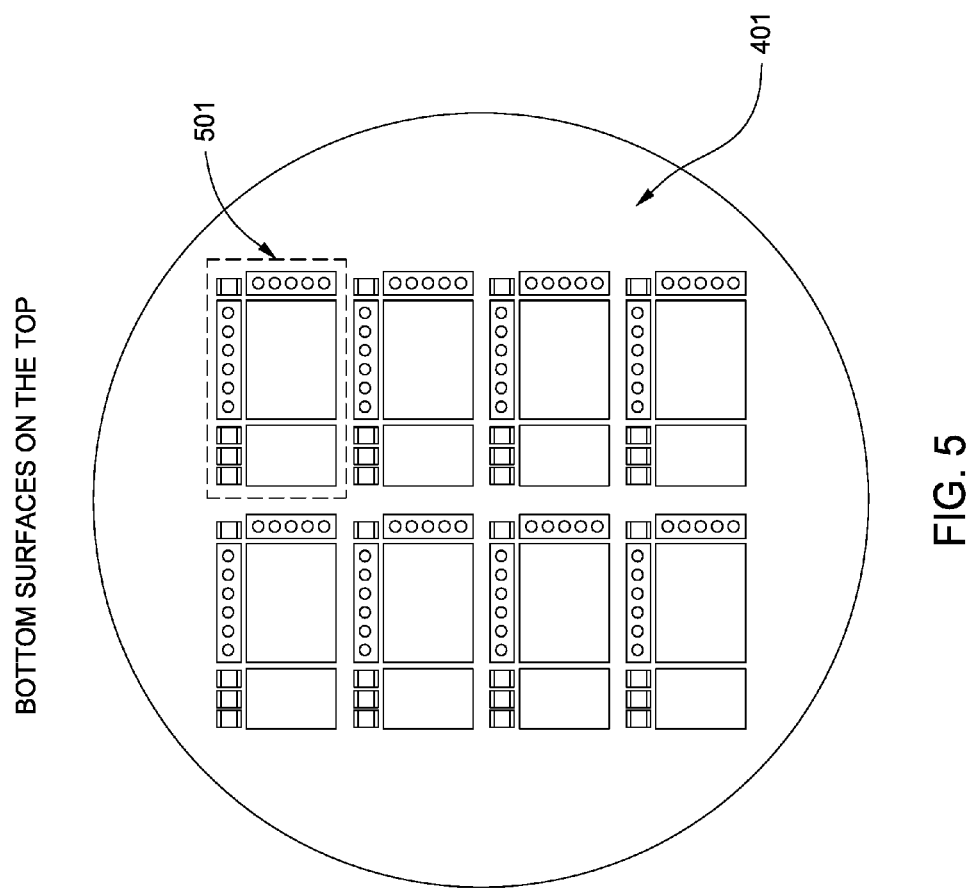
FIG. 5 illustrates disposing multiple sets of the components of the assembly on the carrier, according to one embodiment herein.

Block 202 is described using FIGS. 4 and 5. At block 202, the photonic chip 101, the first electrical chip 102, the substrates 103 and the passive circuit components 104 are disposed side by side on a carrier with respective top surfaces contacting the carrier. FIG. 4 illustrates disposing the components of the assembly 100 on a carrier 401 from the top view and the side view, respectively, according to one embodiment herein. In one embodiment, components of the assembly 100 include the photonic chip 101, the first electrical chip 102, the substrates 103 and the passive circuit components 104. In one example, the carrier 401 may be a tape and/or a steel carrier, as understood in the art.

From the top view, the photonic chip 101, the first electrical chip 102, the substrates 103 and the passive circuit components 104 are disposed side by side on the carrier 401 with respective bottom surfaces facing the top view. As seen from the side view, the respective top surfaces 161, 162, and 163 of the photonic chip 101, the first electrical chip 102, and the substrate 103 contact the carrier 401. On the other hand, the bottom surface 171 of the photonic chip 101, the bottom surface 172 of the first electrical chip 102, and the bottom surface 173 of the substrate 103 are facing away from the carrier 401.

FIG. 5 illustrates disposing multiple sets of the components of the assembly 100 on the carrier 401 from the top view, according to one embodiment herein. As shown in FIG. 5, each set 501 includes the photonic chip 101, the first electrical chip 102, the substrates 103 and the passive circuit components 104 as described in FIG. 4. Similarly as in FIG. 4, in each set 501, the photonic chip 101, the first electrical chip 102, the substrates 103 and the passive circuit components 104 are disposed side by side on the carrier 401 with respective bottom surfaces facing the top view. In the following, blocks 203-210 of the method 200 are described for one set 501 for explanation purpose. As understood by an ordinary person in the art, blocks 203-210 of the method 200 can be performed simultaneously for all the multiple sets 501 disposed on the carrier 401.

Figure 6:
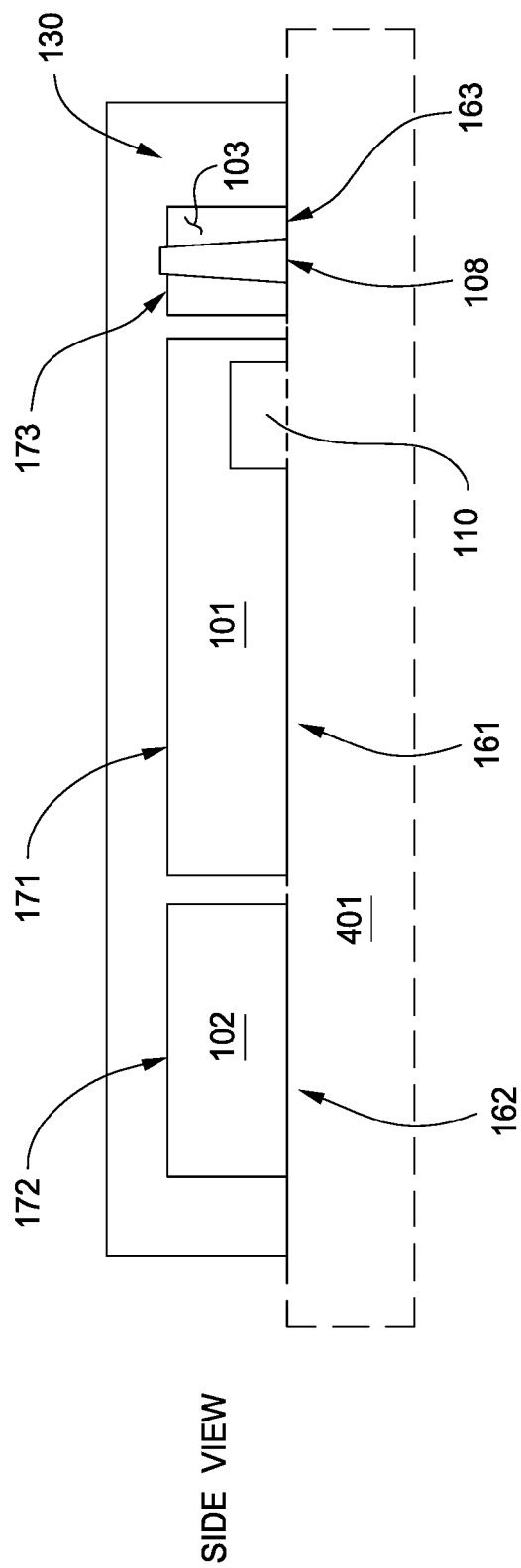
FIG. 6 illustrates encapsulating the components of the assembly using a mold compound, according to one embodiment herein.

Blocks 203 and 204 are described using FIG. 6. At block 203, a mold compound 130 encapsulates the photonic chip 101, the first electrical chip 102, the substrates 103 and the passive circuit components 104. FIG. 6 illustrates encapsulating components of the assembly 100 using the mold compound 130 from the side view, according to one embodiment herein. The mold compound 130 is formed over the respective bottom surfaces of photonic chip 101, the first electrical chip 102, the substrates 103 and the passive circuit components 104 and covers the respective bottom surfaces of those components. For example, the mold compound 130 covers the bottom surface 172 of the first electrical chip 102, the bottom surface 171 of the photonic chip 101 and bottom surface 173 of the substrate 103. Also, the mold compound 130 encapsulates all the sides of the components of the assembly 100. For example, the mold compound 130 may encapsulate the four sides 141-144 of the photonic chip 101.

At block 204, the carrier 401 is removed to expose the top surfaces of the photonic chip 101, the first electrical chip 102 and the substrates 103. In one embodiment, the carrier 401 is removed using wet etch or anodic dissolution, as understood in the art. The ghosted lines in FIG. 6 illustrate that the carrier has been removed. Once removed, the top surface 162 of the first electrical chip 102, the top surface 161 of the photonic chip 101, and the top surface 163 of the substrates 103 are exposed and not covered by the mold compound 130. In one embodiment, the top surface 163 is a top surface of the through-vias 108 which protrudes from the top surface of the substrate 103. In another embodiment, the top surfaces of the passive circuit components 104 are also exposed after removing the carrier 401. In another embodiment, after removing the carrier 401, the optical interface 110 is also exposed and not covered by the mold compound 130. After removing the carrier 401, the mold compound 130 encapsulating multiple sets 501 forms a reconstituted wafer. That is, the mold compound 130 provides sufficient physical support to the sets 501 for moving and processing the components as described below. However, in other embodiments, the surface of the mold compound 130 opposite the top surface 161 may be coupled to a carrier in order to provide additional support.

Figure 7:
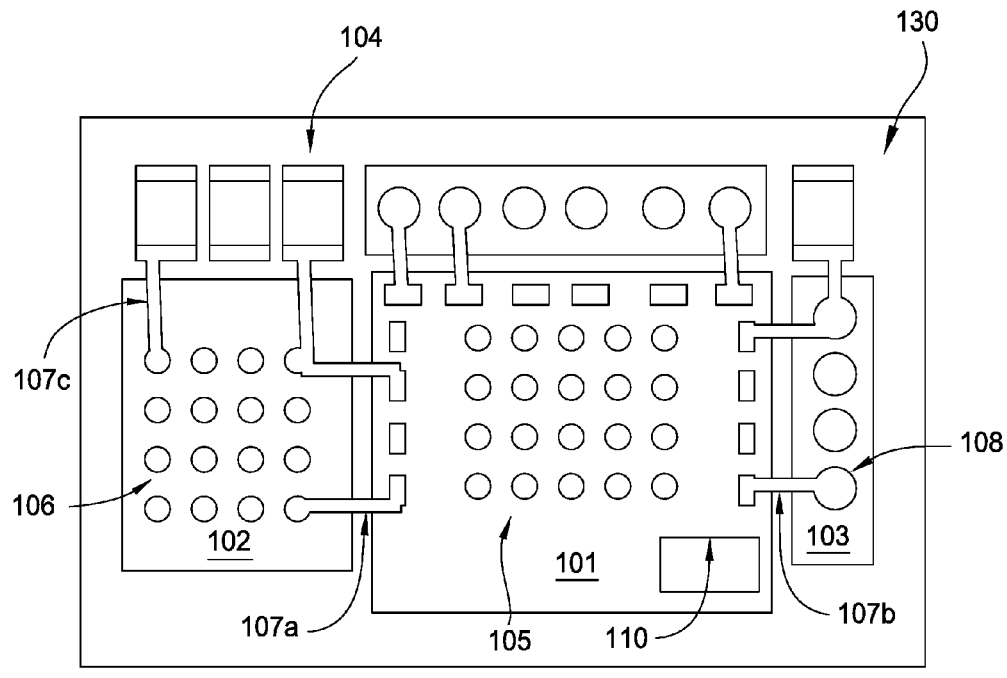
FIG. 7 illustrates the components of the assembly encapsulated by the mold compound, according to one embodiment herein.
Figure 7:
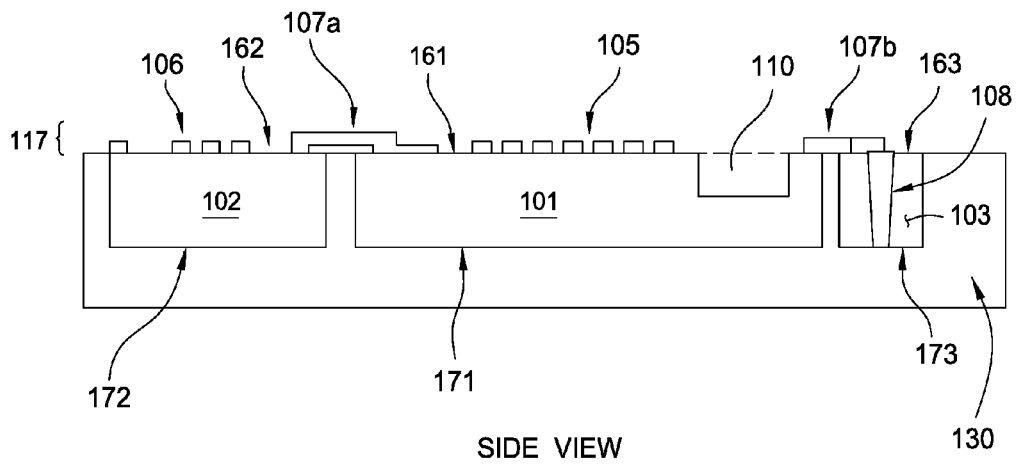

Block 205 is described using FIG. 7. At block 205, the reconstituted wafer described above is flipped and pads are formed on the top surfaces of the photonic chip 101 and the first electrical chip 102. FIG. 7 illustrates the components of the assembly 100, i.e., one set 501, encapsulated by the mold compound 130 from the top view and the side view, respectively, according to one embodiment herein. From the top view, as shown in FIG. 7, the pads 105 are formed on the top surface of the photonic chip 101, and the pads 106 are formed on the top surface of the first electrical chip 102. In one embodiment, the pads 105 and 106 are formed by performing Under Bump Metallization (UBM) plating on the top surfaces of the photonic chip 101 and the first electrical chip 102, as understood in the art. Similarly, from the side view, the pads 105 are formed on the top surface 161 of the photonic chip 101, and the pads 106 are formed on the top surface 162 of the first electrical chip 102.

Figure 8:
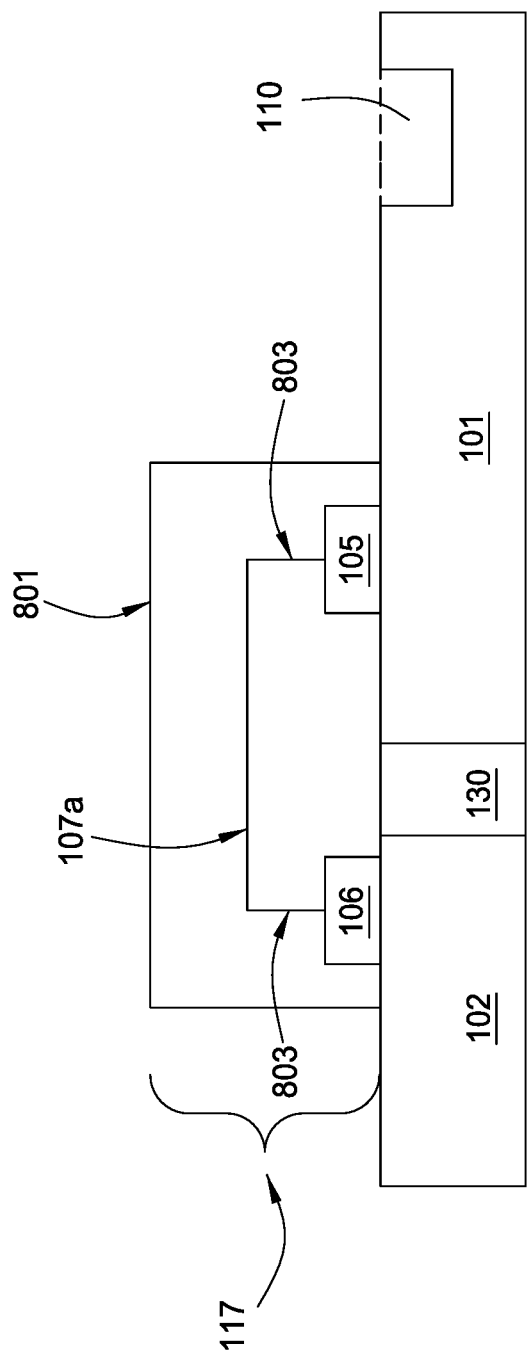
FIG. 8 illustrates using a first RDL to connect a photonic chip with an electrical chip, according to one embodiment herein.

Block 206 is described using FIGS. 7 and 8. At block 206, electrical connections in the first RDL 117 are formed, where the first RDL 117 extends across the top surfaces of the photonic chip 101, the first electrical chip 102, the substrates 103 and/or the passive circuit components 104. In one embodiment, the RDL 117 is formed by using photolithography process in order to interconnect multiple components of the assembly 100. For example, as shown in FIG. 7, the electrical connection 107a in the RDL 117 connects the pads 105 on the top surface 161 of the photonic chip 101 and the pads 106 on the top surface 162 of the first electrical chip 102. In another example, the electrical connection 107b in the RDL 117 connects the pads 105 on the top surface 161 of the photonic chip 101 and the through-vias 108 on the top surface 163 of the substrates 103. In another example, the first electrical chip 102 and/or the substrates 103 can be connected to the passive circuit components 104 using the electrical connections in the RDL 117, e.g., the electrical connection 107c. In one embodiment, the optical interface 110 is exposed and not covered by the RDL 117. This can be achieved by using photoresist in the photolithography process when forming the RDL 117 on the top surface 161 of the photonic chip 101, as understood in the art.

FIG. 8 illustrates a detailed view of the RDL 117 used to connect the photonic chip 101 and the first electrical chip 102, according to one embodiment herein. As shown in FIG. 8, the RDL 117 includes two layers, i.e., a dielectric layer 801 and a routing layer, i.e., the electrical connection 107a. In one example, the dielectric layer 801 can be a polyamide (PI) dielectric layer. The routing layer 107a may include any number of conductive routing traces which may be made using copper, tungsten or any other conductive material as understood in the art. The electrical connection 107a connects to the pads 105 on the top surface of the photonic chip 101 and the pads 106 on the top surface of the first electrical chip 102 through two electrical vias 803, respectively. In one embodiment, the RDL 117 may include different or additional layers, e.g., a passivation layer, as understood in the art. In other embodiments, the RDL 117 can connect different components of the assembly 100, e.g., the photonic chip 101 and the substrates 103, in a similar way. In one embodiment, the second RDL 122 has a similar structure as the first RDL 117. In another embodiment, multiple layers of RDL such as 117 and 122 may be used.

Figure 9:
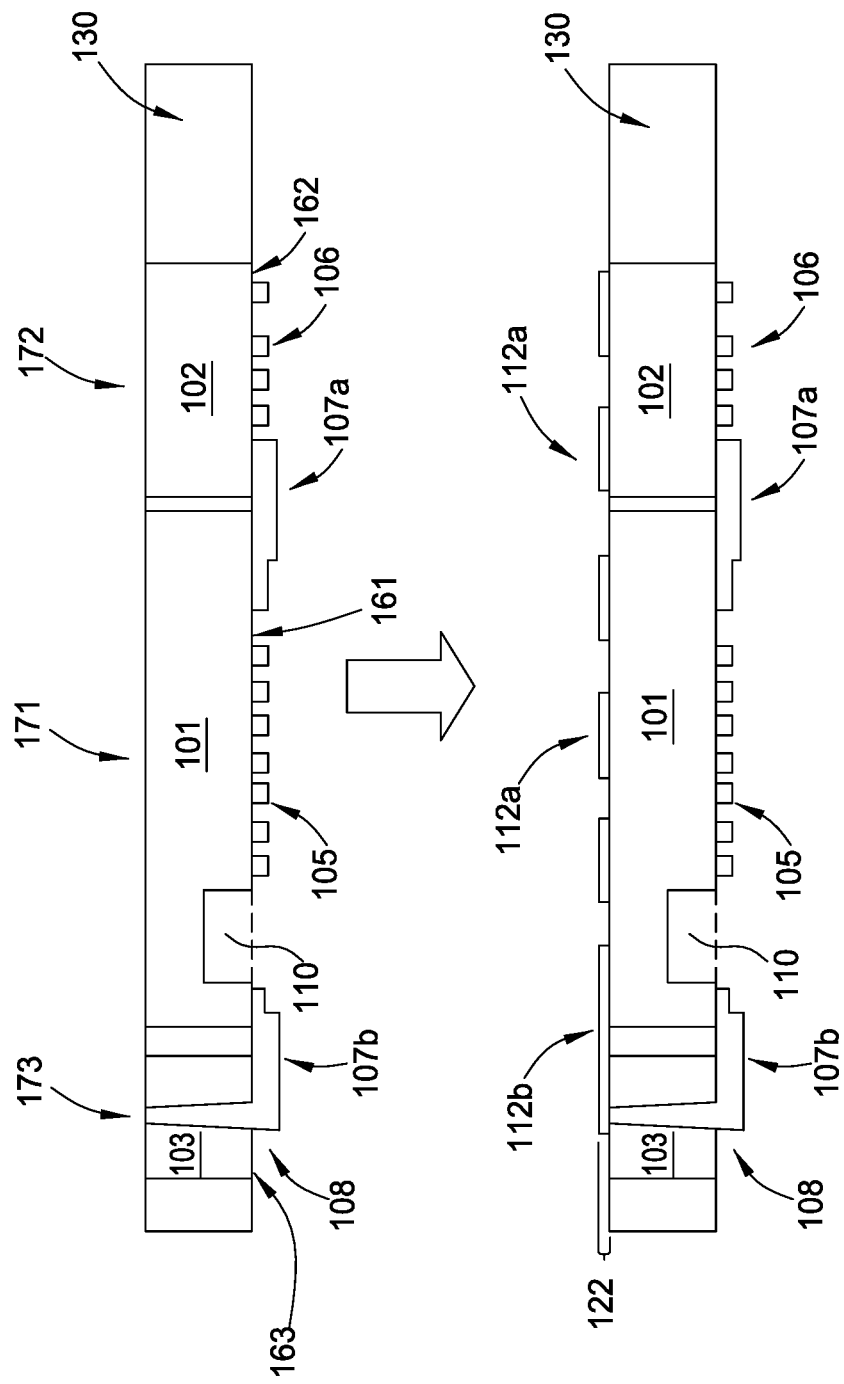
FIG. 9 illustrates forming a second RDL, according to one embodiment herein.

Block 207 is described using FIG. 9. At block 207, a second RDL is formed, where the second RDL extends across the bottom surfaces of the photonic chip 101, the first electrical chip 102, and the substrates 103. FIG. 9 illustrates forming the second RDL 122, according to one embodiment herein. After forming the first RDL 117, the reconstituted wafer is flipped again such that the respective bottom surfaces of the photonic chip 101, the first electrical chip 102 and the substrates 103 are on the top. Mold backgrinding is performed to remove the mold compound 130 covering the respective bottom surfaces in order to expose the respective bottom surfaces. In one embodiment, mold backgrinding also exposes the through-vias 108 on the bottom surface 173 of the substrates 103. For example, as shown in FIG. 9, after removing the mold compound 130, the bottom surface 171 of the photonic chip 101, the bottom surface 172 of the first electrical chip 102 and the bottom surface 173 of the substrates 103 are exposed. The second RDL 122 is formed at the bottom surfaces of the photonic chip 101, the first electrical chip 102 and the substrates 103. For example, the second RDL 122 provides pads 112a on the bottom surface 171 of the photonic chip 101 and the bottom surface 172 of the first electrical chip 102 and also provides the electrical connection 112b on the bottom surface 173 of the substrates 103. In one embodiment, the electrical connection 112b on the bottom surface 173 of the substrates 103 is attached to the exposed through-vias 108 on the bottom surface 173 of the substrates 103.

Figure 10:
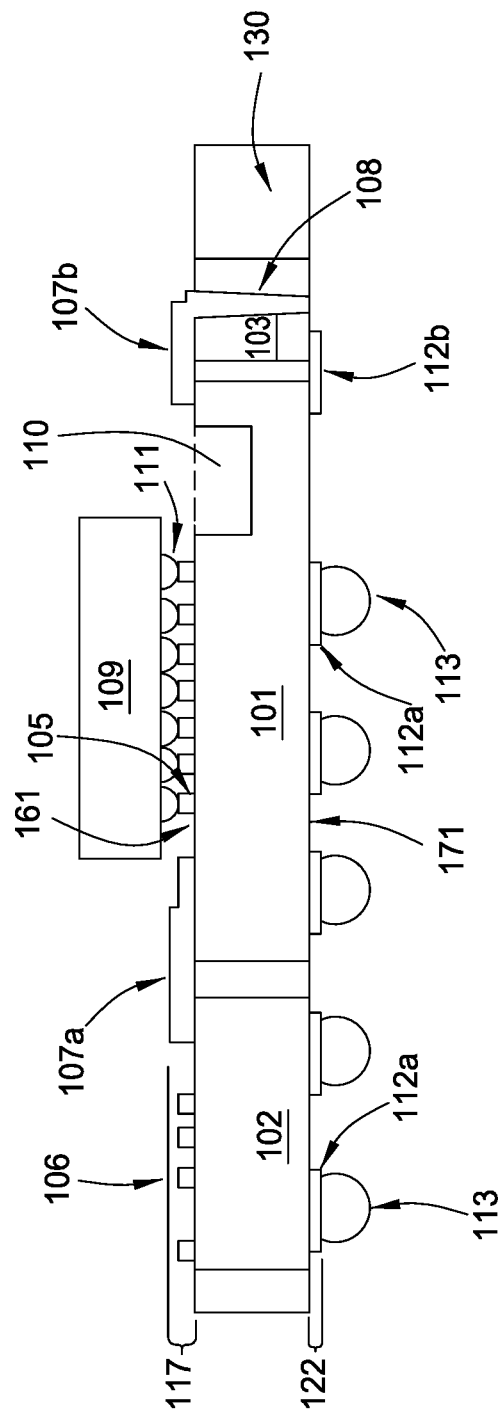
FIG. 10 illustrates disposing solder bumps on the components of the assembly, according to one embodiment herein.

Blocks 208 and 209 are described using FIG. 10. At block 208, solder bumps are disposed on the pads on the top surface and the bottom surface of the photonic chip 101. FIG. 10 illustrates disposing solder bumps on the components of the assembly 100, according to one embodiment herein. As shown in FIG. 10, solder bumps 111 are disposed on the pads 105 formed on the top surface 161 of the photonic chip 101. Similarly, solder bumps 113 are disposed on the pads 112a formed on the respective bottom surfaces 171 and 172 of the photonic chip 101 and the first electrical chip 102. In one embodiment, the pads 112a are formed by the second RDL 122 on the respective bottom surfaces of the photonic chip 101 and the first electrical chip 102.

Figure 11:
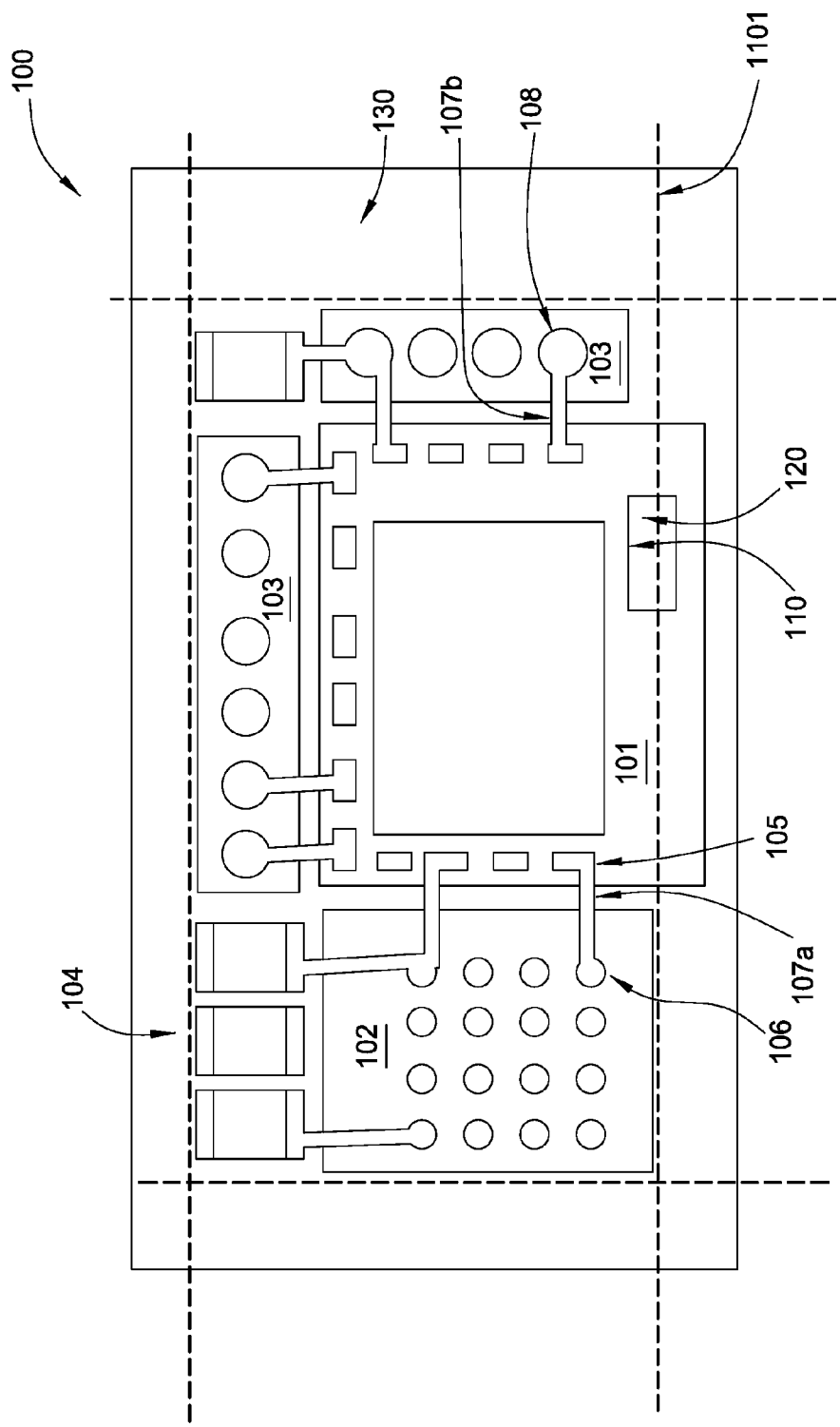
FIG. 11 illustrates dicing the mold compound to expose an optical interface on a photonic chip, according to one embodiment herein.

At block 209, the second electrical chip 102 is connected to the top surface of the photonic chip 101 using the solder bumps on the top surface of the photonic chip 101. As shown in FIG. 10, the second electrical chip 109 is disposed above the photonic chip 101 and attached to the top surface 161 of the photonic chip 101 using the solder bumps 111 disposed on the pads 105. After connecting the second electrical chip 102 to the top surface 161 of the photonic chip 101, the assembly 100 described in FIG. 1 is formed Block 210 is described using FIG. 11. At block 210, the mold compound 130 encapsulating the assembly 100 is sawed to provide a separate assembly 100 that can be attached to a PCB. In one embodiment, when sawing the mold compound 130 along the dotted line extending through the photonic chip 101, the photonic chip 101 is also sawed through the trench 120 to expose the optical interface 110 on the photonic chip 101. FIG. 11 illustrates sawing photonic chip 101 to expose the optical interface 110, according to one embodiment herein. As shown in FIG. 11, the mold compound 130 encapsulating the assembly 100 and the photonic chip 101 are sawed or diced along the four dashed lines to separate the assembly 100 from the reconstituted wafer. In order to expose the optical interface 110 to an external optical device, the photonic chip 101 is sawed through the trench 120 along the dashed line 1101. In this way, after the dicing, the optical interface 110 is exposed such that an external optical device can connect to the photonic chip 101 through the exposed optical interface 110. In one embodiment, if the photonic chip 101 is thin (e.g., around 500 microns), a thin saw blade can be used to saw the photonic chip 101 and the mold compound 130.

Figure 12:
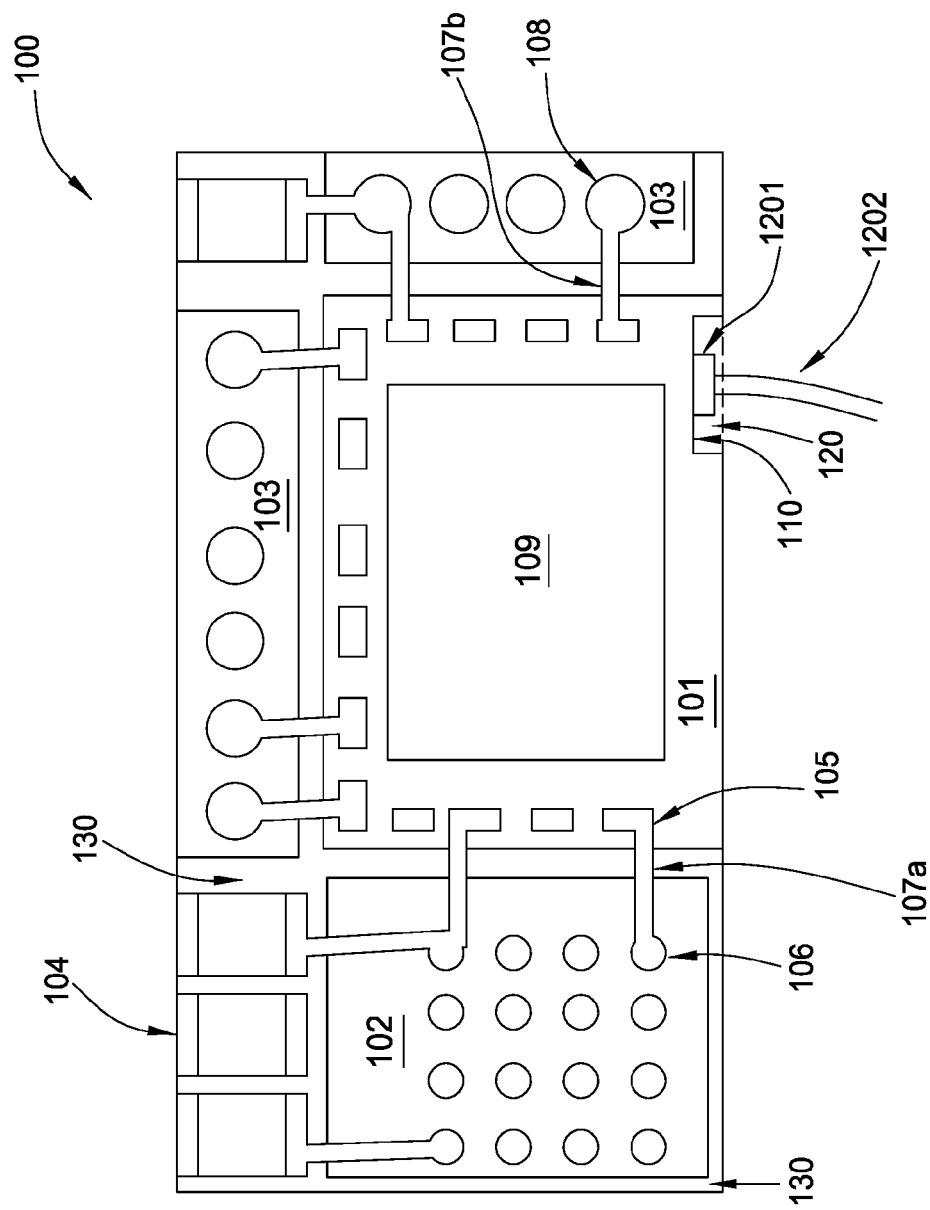
FIG. 12 illustrates connecting an external optical device to the photonic chip through the exposed optical interface, according to one embodiment herein.

FIG. 12 illustrates connecting an external optical device to the photonic chip 101 through the exposed optical interface 110, according to one embodiment herein. In FIG. 12, an external optical device 1201, e.g., an optical fiber assembly is coupled to the exposed optical interface 110. The external optical device 1201 is coupled to one or more optical fibers 1202. From the top view, the 1201 is directly attached to the side of the trench 120 providing the optical interface 110.

Figure 13:
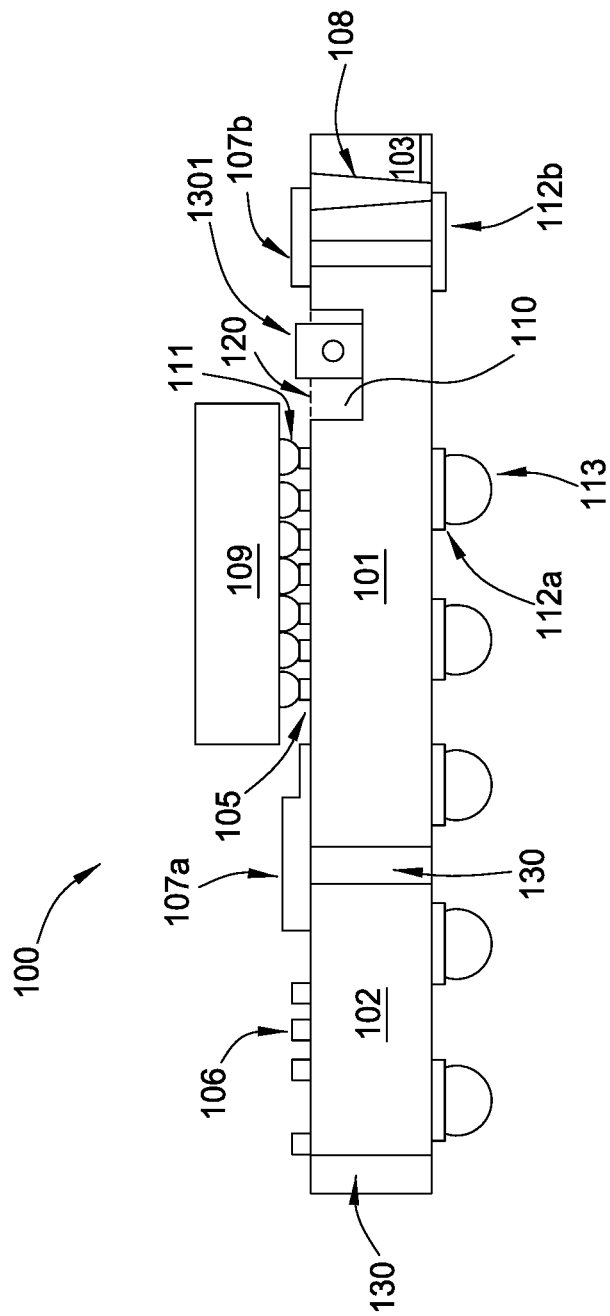
FIG. 13 illustrates connecting an external optical device to the photonic chip through the exposed optical interface, according to another embodiment herein.

FIG. 13 illustrates a side view of connecting an external optical device to the photonic chip 101 through the exposed optical interface 110, according to one embodiment herein. In FIG. 13, an external optical device 1301, e.g., a lens, is coupled to the exposed optical interface 110. From the side view, the external optical device 1301 is disposed on the bottom surface of the trench 120 and coupled to the side of the trench 120 providing the optical interface 110. In one embodiment, the lens may be used to adjust the mode size of the optical signal to better match the dimensions of the waveguide used to carry the optical signal in the photonic chip 101.

Figure 14:
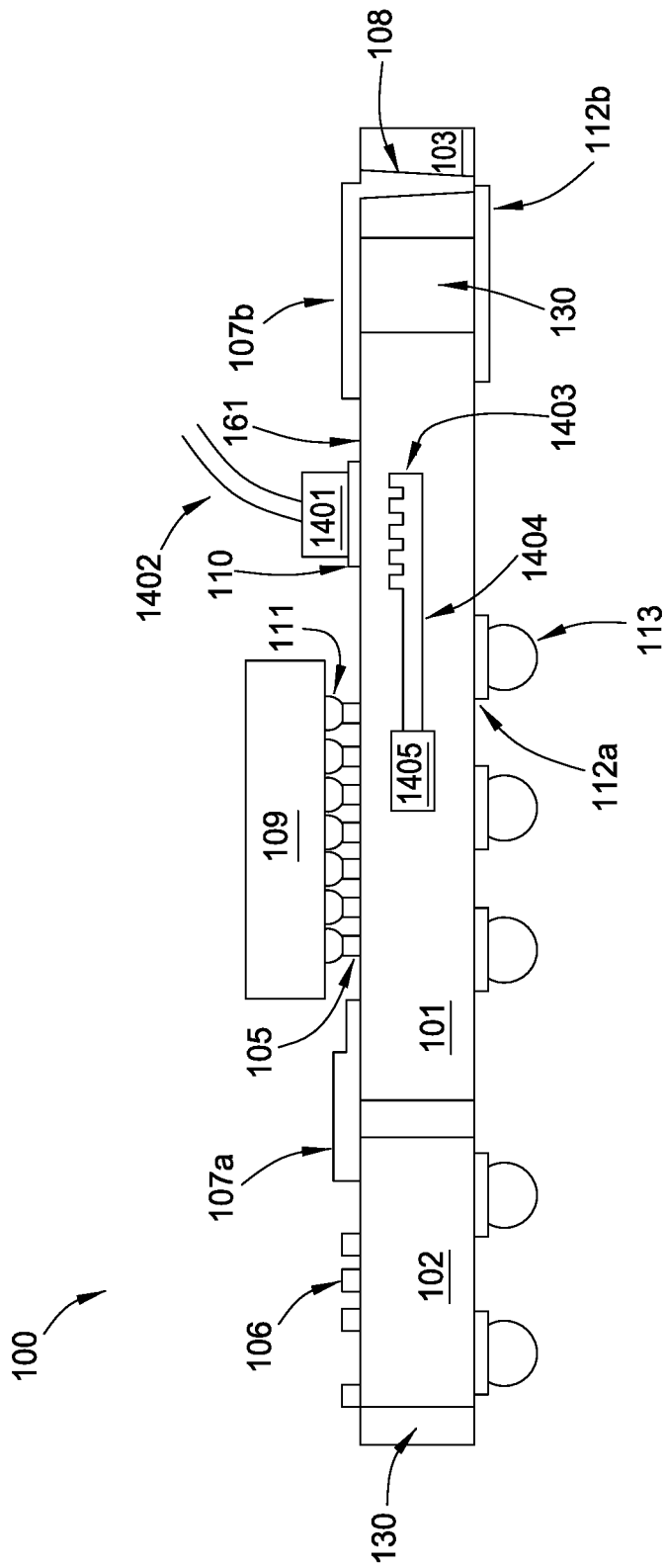
FIG. 14 illustrates connecting an external optical device to the photonic chip including a grating coupler, according to another embodiment herein.

FIG. 14 illustrates connecting an external optical device to the photonic chip 101 with a grating coupler, according to another embodiment herein. In FIG. 14, the photonic chip 101 does not have the trench 120. Instead, the optical interface 110 is exposed on the top surface 161 of the photonic chip 101. The external optical device 1401, e.g., an optical fiber assembly, is coupled to the exposed optical interface 110. The external optical device 1401 is coupled to optical fibers 1402. The photonic chip 101 includes a grating coupler 1403. The grating coupler 1403 connects to an optical component 1405 inside the photonic chip 101 through one or more waveguides 1404. The optical interface 110 is coupled to the grating coupler 1403 in the photonic chip 101. Although in FIG. 14 the grating coupler 1403 is shown as being recessed from the top surface 161, in another embodiment, the grating coupler 1403 can be exposed on the top surface 161. In one embodiment, the optical interface 110 transmits optical signals between the grating coupler 1403 and the external optical device 1401.

Figure 15:
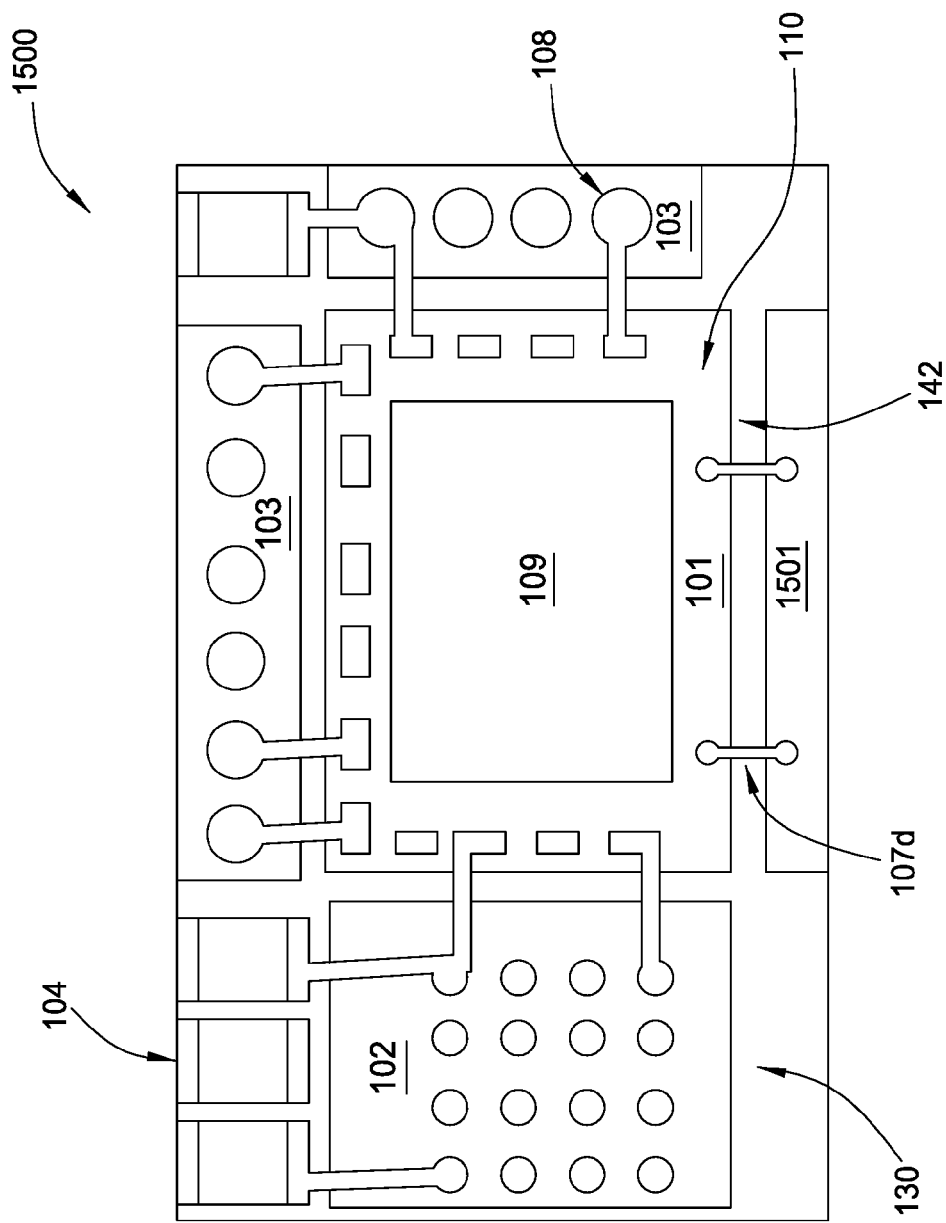
FIG. 15 illustrates an assembly, according to another embodiment herein.

FIG. 15 illustrates an assembly 1500, according to another embodiment herein. In the assembly 1500, the photonic chip 101 does not have the trench 120. Instead, the optical interface 110 is exposed and on the top surface of the photonic chip 101. Also, the photonic chip 101 includes a grating coupler 1403 inside (not shown in FIG. 15), as described in FIG. 14. Since the photonic chip 101 does not have the trench 120, the photonic chip 101 can be connected to one or more additional electrical chips, e.g., the electrical chip 1501, along the side 142 through the electrical connection 107d in the first RDL 117, similarly as described. In the previous embodiments described above, since the photonic chip 101 includes the trench 120 on the side 142, the photonic chip 101 is not connected to another electrical chip 1501 along the side 142 through the electrical connection 107d. Thus, the embodiment in FIG. 15 provides connections to additional electrical chips.

The assembly 100 in the present disclosure provides several advantages. For example, the I/O interfaces can be arranged on the RDL 117, which increases the number of I/O interfaces comparing to using wire bonding. Also, the optical interface 110 is not covered by the mold compound 130 and the RDL 117 and can be used to communicate optical signals with external optical devices.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

In view of the foregoing, the scope of the present disclosure is determined by the claims that follow.

We claim:

1. A method, comprising:
encapsulating a photonic chip and a first electrical chip using a mold compound, wherein the photonic chip and the first electrical chip are disposed side by side with respective top surfaces facing a same direction, wherein the respective top surfaces are free from the mold compound after encapsulating the photonic chip and the first electrical chip;
forming a first redistribution layer (RDL) that extends across the top surface of the photonic chip and the top surface of the first electrical chip, wherein the first RDL is configured to connect the photonic chip with the first electrical chip;
removing the mold compound to expose an optical interface on the photonic chip; and
aligning an external optical device to the optical interface, wherein the external optical device and the photonic chip are configured to transmit optical signals through the optical interface.

2. The method of claim 1, further comprising:
forming a second RDL that extends across respective bottom surfaces of the photonic chip and the first electrical chip, wherein the second RDL comprises pads on the respective bottom surfaces, and wherein the respective bottom surfaces are opposite to the respective top surfaces.

3. The method of claim 1, wherein the first RDL comprises pads and the method further comprises disposing a second electrical chip on the top surface of the photonic chip through the pads.

4. The method of claim 2, wherein a plurality of vertical interconnect accesses (vias) extends between the first RDL and the second RDL, and wherein the first RDL electrically connects the photonic chip to at least one of the plurality of vias.

5. The method of claim 4, wherein the plurality of vias is disposed in one or more substrates encapsulated by the mold compound.

6. The method of claim 4, wherein the plurality of vias is disposed in the mold compound.

7. The method of claim 1, wherein the photonic chip comprises a trench on the top surface of the photonic chip, and wherein one of the sides of the trench defines the optical interface.

8. The method of claim 7, further comprising:
sawing through the trench before aligning the external optical device to the optical interface.

9. The method of claim 1, wherein the photonic chip comprises a grating coupler.

10. An assembly, comprising:
a photonic chip;
a first electrical chip;
a mold compound encapsulating the photonic chip and the first electrical chip, wherein the photonic chip and the first electrical chip are disposed side by side with respective top surfaces facing a same direction, wherein the respective top surfaces are free from the mold compound;
a first redistribution layer (RDL) that extends across the top surface of the photonic chip and the top surface of the first electrical chip, wherein the first RDL is configured to connect the photonic chip with the first electrical chip; wherein the photonic chip comprises an exposed optical interface configured to transmit optical signals between the photonic chip and an external optical device; and
a second RDL that extends across respective bottom surfaces of the photonic chip and the first electrical chip, wherein the second RDL comprises pads on the respective bottom surfaces, and wherein the respective bottom surfaces are opposite to the respective top surfaces.

11. An assembly, comprising:
a photonic chip;
a first electrical chip;
a mold compound encapsulating the photonic chip and the first electrical chip, wherein the photonic chip and the first electrical chip are disposed side by side with respective top surfaces facing a same direction, wherein the respective top surfaces are free from the mold compound;
a first redistribution layer (RDL) that extends across the top surface of the photonic chip and the top surface of the first electrical chip, wherein the first RDL is configured to connect the photonic chip with the first electrical chip; wherein the photonic chip comprises an exposed optical interface configured to transmit optical signals between the photonic chip and an external optical device, wherein the first RDL comprises pads; and
a second electrical chip disposed on the top surface of the photonic chip through the pads.

12. The assembly of claim 10, wherein a plurality of vertical interconnect accesses (vias) extends between the first RDL and the second RDL, and wherein the first RDL electrically connects the photonic chip to at least one of the plurality of vias.

13. The assembly of claim 12, wherein the plurality of vias is disposed in one or more substrates encapsulated by the mold compound.

14. The assembly of claim 12, wherein the plurality of vias is disposed in the mold compound.

15. An assembly, comprising:
a photonic chip;
a first electrical chip;
a mold compound encapsulating the photonic chip and the first electrical chip, wherein the photonic chip and the first electrical chip are disposed side by side with respective top surfaces facing a same direction, wherein the respective top surfaces are free from the mold compound; and
a first redistribution layer (RDL) that extends across the top surface of the photonic chip and the top surface of the first electrical chip, wherein the first RDL is configured to connect the photonic chip with the first electrical chip; wherein the photonic chip comprises an exposed optical interface configured to transmit optical signals between the photonic chip and an external optical device,
wherein the photonic chip comprises a trench on the top surface of the photonic chip, and wherein one of the sides of the trench defines the optical interface.

16. The assembly of claim 15, wherein the photonic chip is sawed through the trench before using the exposed optical interface to transmit optical signals between the photonic chip and the external optical device.

17. An assembly, comprising:
a photonic chip, wherein the photonic chip comprises a grating coupler;
a first electrical chip;
a mold compound encapsulating the photonic chip and the first electrical chip, wherein the photonic chip and the first electrical chip are disposed side by side with respective top surfaces facing a same direction, wherein the respective top surfaces are free from the mold compound;
a first redistribution layer (RDL) that extends across the top surface of the photonic chip and the top surface of the first electrical chip, wherein the first RDL is configured to connect the photonic chip with the first electrical chip; wherein the photonic chip comprises an exposed optical interface configured to transmit optical signals between the photonic chip and an external optical device.

18. An assembly, comprising:
a photonic chip comprising a first side, a second side and a third side, wherein the first, the second and the third sides are perpendicular to a top surface and an opposite bottom surface of the photonic chip, and wherein the top surface and the bottom surface of the photonic chip comprise pads for attaching solder bumps;
a first electrical chip facing the first side of the photonic chip;

a first redistribution layer (RDL) that extends across the top surface of the photonic chip and a top surface of the first electrical chip, wherein the first RDL is configured to connect the photonic chip with the first electrical chip;

an exposed optical interface on the third side of the photonic chip; and a mold compound configured to cover the first side and the second side of the photonic chip without covering the third side of the photonic chip.

19. The assembly of claim 18, further comprising a plurality of vias disposed along the second side.

* * * * *

UNITED STATES PATENT AND TRADEMARK OFFICE
CERTIFICATE OF CORRECTION

PATENT NO. : 9,964,719 B1
APPLICATION NO. : 15/582370
DATED : May 8, 2018
INVENTOR(S) : Sandeep Razdan et al.

Page 1 of 1

It is certified that error appears in the above-identified patent and that said Letters Patent is hereby corrected as shown below:

On the Title Page

Under "(*) Notice:", Line 3, delete the phrase "days. days." and insert -- days. --, therefor.

In the Specification

In Column 5, Line 38, delete "The method 200 begins with at block 201," and insert -- The method 200 begins at block 201, --, therefor.

In Column 9, Line 9, after "formed" insert -- . --.

Signed and Sealed this
Sixteenth Day of October, 2018

Andrei Iancu
*Director of the United States Patent and Trademark Office*